US009951884B2

(12) United States Patent
Yeh

(10) Patent No.: US 9,951,884 B2
(45) Date of Patent: Apr. 24, 2018

(54) TEMPERATURE CONTROL VALVE

(71) Applicants: Shih-Feng Liang, Taichung (TW);
Chun-Lin Yeh, Taichung (TW);
Ching-Lung Lai, Taichung (TW)

(72) Inventor: Chun-Lin Yeh, Taichung (TW)

(73) Assignee: HUO JHIH CO., LTD. (TW)

(*) Notice: Subject to any disclaimer, the term of this patent is extended or adjusted under 35 U.S.C. 154(b) by 0 days.

(21) Appl. No.: 15/303,846

(22) PCT Filed: Dec. 2, 2014

(86) PCT No.: PCT/CN2014/092784
§ 371 (c)(1),
(2) Date: Oct. 13, 2016

(87) PCT Pub. No.: WO2016/086353
PCT Pub. Date: Jun. 9, 2016

(65) Prior Publication Data
US 2017/0030483 A1 Feb. 2, 2017

(51) Int. Cl.
*F16K 49/00* (2006.01)
*B67D 3/00* (2006.01)
(Continued)

(52) U.S. Cl.
CPC .......... *F16K 49/002* (2013.01); *B67D 3/0009* (2013.01); *B67D 3/045* (2013.01);
(Continued)

(58) Field of Classification Search
CPC ...... F16K 49/00; F16K 49/002; F16K 31/002; B67D 3/0009; B67D 3/0022; H01L 35/00–35/34; A47J 31/4403
(Continued)

(56) References Cited

U.S. PATENT DOCUMENTS 1,988,289 A * 1/1935 Wittemann .......... G05D 23/275
137/341
2,007,358 A * 7/1935 Anger ................. F16K 31/0651
137/204
(Continued)

FOREIGN PATENT DOCUMENTS

CN 2114072 8/1993
CN 2162566 4/1994
(Continued)

*Primary Examiner* — Michael R Reid
*Assistant Examiner* — Jonathan Waddy
(74) *Attorney, Agent, or Firm* — Bruce Stone LLP; Joseph Bruce

(57) ABSTRACT

A temperature control valve includes a main body, a metal valve assembly and a thermoelectric chip unit. The main body has a first inlet and a first outlet. The metal valve assembly is movably disposed in the main body and includes inlet and outlet ends, the metal valve assembly has a closed end engaged with the main body and an operating end operable from outside of the main body to operate the metal valve assembly, and the operating end is operated to control the first inlet, the first outlet, the inlet end and the outlet end to communicate or non-communicate with one another. The thermoelectric chip unit has a first end abutting against the closed end and a second end and is disposed on the main body, one of the first and second ends is a cold end, and the other is a hot end.

10 Claims, 7 Drawing Sheets

(51) Int. Cl.
*H01L 35/00* (2006.01)
*F16K 3/24* (2006.01)
*F16K 5/04* (2006.01)
*F16K 31/00* (2006.01)
*F16K 31/06* (2006.01)
*B67D 3/04* (2006.01)
*A47J 31/44* (2006.01)

(52) U.S. Cl.
CPC .............. *F16K 3/24* (2013.01); *F16K 5/0407* (2013.01); *F16K 31/002* (2013.01); *F16K 31/0675* (2013.01); *F16K 49/00* (2013.01); *H01L 35/00* (2013.01); *A47J 31/4403* (2013.01)

(58) Field of Classification Search
USPC .... 137/334, 338, 341; 222/54, 146.1–146.6; 236/93 R
See application file for complete search history.

(56) References Cited

U.S. PATENT DOCUMENTS

| | | | | | |
|---|---|---|---|---|---|
| 2,020,492 | A | * | 11/1935 | Zahm | B67D 1/1252 137/341 |
| 3,098,497 | A | * | 7/1963 | Glasgow | F16K 49/00 137/248 |
| 3,782,681 | A | * | 1/1974 | Blackstein | F16K 5/04 137/457 |
| 3,938,544 | A | * | 2/1976 | Bernaerts | F16K 5/00 137/334 |
| 4,715,400 | A | * | 12/1987 | Gardner | F16K 1/2263 137/340 |
| 4,871,089 | A | * | 10/1989 | Rader | A47J 31/402 222/146.5 |
| 5,501,077 | A | * | 3/1996 | Davis | B67D 3/00 62/3.64 |
| 5,531,245 | A | * | 7/1996 | Sparks | F16K 49/002 137/13 |
| 6,227,236 | B1 | * | 5/2001 | Kusumoto | F16K 31/047 118/620 |
| 6,333,586 | B1 | * | 12/2001 | Polach | F02M 47/027 310/328 |
| 6,536,458 | B1 | * | 3/2003 | Kindermann | E03B 7/12 137/341 |
| 8,783,283 | B2 | * | 7/2014 | Kriz | F16K 49/002 137/334 |
| 2002/0185626 | A1 | * | 12/2002 | Newberg | F16K 5/0678 251/315.01 |
| 2007/0209710 | A1 | * | 9/2007 | Gottsmann | F16K 49/002 137/341 |
| 2012/0211204 | A1 | * | 8/2012 | Agonafer | H01L 23/473 165/104.31 |

FOREIGN PATENT DOCUMENTS

| | | |
|---|---|---|
| CN | 2185355 | 12/1994 |
| CN | 102077004 | 5/2011 |
| CN | 202580088 | 12/2012 |
| CN | 203548969 | 4/2014 |
| JP | H 101705 | 1/1998 |
| WO | WO 9407556 | 4/1994 |

* cited by examiner

TEMPERATURE CONTROL VALVE

BACKGROUND OF THE INVENTION

Field of the Invention

The present invention relates to a valve, and more particularly to a temperature control valve.

Description of the Prior Art

To fully present the flavor of coffee, people uses ice water to extract the essence of coffee. A common cold drip coffee pot has an upper pot body for receiving ice cubes, ice water produced after the ice cubes melted flows through a filter unit which has coffee powder to conduct an extraction process in a low temperature, and ice coffee extracted flows into a lower pot body to be saved. During the extraction process, a valve is usually arranged between the upper pot body and the filter unit so as to control a flow velocity of the ice water.

However, in this type of cold drip coffee technique, a user needs to produce a large number of ice cubes first and put the ice cubes in the upper pot body to melt the ice cubes. During the processes of producing and melting the ice cubes, there are unnecessary power losses, the ice water which is produced after the ice cubes melted flows through a tube which is not heat-isolated and exchange heat with outside to make a temperature of the ice water rise, and the flavor of the cold drip coffee becomes less preferable. In addition, a volume of the cold drip coffee pot is great, so it is inconvenient for the user to move the cold drip coffee pot.

The present invention has arisen to mitigate and/or obviate the afore-described disadvantages.

SUMMARY OF THE INVENTION

The major object of the present invention is to provide a temperature control valve which has a function to make a temperature of a liquid to rise or fall and can be used in a cold drip coffee device, a drip set for medical care or a cutting fluid nozzle for mechanical processing. The temperature control valve has a metal valve assembly and a thermoelectric chip unit, the thermoelectric chip unit can heat or cool the metal valve assembly and adjust a temperature of a fluid flowing into the metal valve assembly. For example, when the temperature control valve is arranged in the cold drip coffee device, the fluid can be heated directly to a temperature near that of a human body so that when a person drinks the liquid, s/he will not feel uncomfortable.

In addition, the temperature control valve integrates the operating end and the temperature control device in a same space, so that the temperature control valve has a smaller total volume and is convenient to be put away. For example, compared with prior arts, when the temperature control valve is used in a cold drip coffee device, there is no need to arrange a pot for receiving ice cubes, just arrange the temperature control valve on an outlet end of a fluid, then ice water will flow out.

Furthermore, the temperature control valve has a main body which partly covers the metal valve assembly therein to prevent the metal valve assembly which serves as a heat-conducting body from exchanging heat with outside and wasting energy so as to achieve greater transferring efficiency.

To achieve the above and other objects, a temperature valve body is provided, including a main body, a metal valve assembly and a thermoelectric chip unit. The main body has an interior space, a first inlet and a first outlet which communicate with the interior space; the metal valve assembly is movably disposed in the interior space and includes an inlet end and an outlet end, one of two ends of the metal valve assembly on an axial direction is a closed end which is engaged with and within the main body, the other of the two ends of the metal valve assembly is an operating end which is operable from outside of the main body to operate the metal valve assembly, the operating end is operated to control the first inlet, the first outlet, and the inlet end and the outlet end to communicate or non-communicate with one another; the thermoelectric chip unit has a first end and a second end and is disposed on a side of the main body, the first end of the thermoelectric chip unit abuts against the closed end, one of the first end and the second end is a cold end, and the other of the first end and the second end is a hot end.

The second end of the thermoelectric chip unit has a heat-dissipating module.

The heat-dissipating module has a heat-dissipating device and a fan, one of two sides of the heat-dissipating device abuts against the second end of the thermoelectric chip unit, and the fan is arranged on the other of the two sides of the heat-dissipating device.

A side of the main body further extends radially to form at least one fixation ear portion, and the at least one fixation ear portion is assembled with the heat-dissipating module.

The metal valve assembly includes a metal tube member, one of the two ends of the metal tube member is the closed end and has a plate body, a circumferential wall of the metal valve member has the inlet end and the outlet end, the inlet end and the outlet end are on different axes, and the operating end is connected to the other of the two ends of the metal tube member.

The operating end is a turning knob which is rotatable relative to the main body and is capable of being operated and controlled to cooperate with the metal tube member, and rotation of the turning knob proceeds to control the first inlet and the first outlet to communicate or non-communicate with the inlet end and the outlet end.

The operating end is an operating knob which is axially movable relative to the metal tube member, and the operating knob is operated to optionally cover or non-cover one of the first inlet, the first outlet, the inlet end and the outlet end so as to control the first inlet to communicate or non-communicate with the first outlet.

The metal tube member is a copper tube.

The operating end includes an electromagnetic valve disposed in the metal valve assembly, and at least one of the electromagnetic valve, the heat-dissipating module and the thermoelectric chip unit is electrically connected to the controlling module.

At least one of the first inlet and the first outlet of the main body has a threaded portion.

The temperature control valve can make a temperature rise or fall and can be used in devices like a cold drip coffee pot, a drip set or a cutting fluid nozzle. In addition, the temperature control valve occupies has a smaller volume and is convenient to be put away. The main body covers the metal valve assembly to prevent the metal valve assembly from exchanging heat with outside and wasting energy so as to achieve greater transferring efficiency The present invention will become more obvious from the following description when taken in connection with the accompanying drawings, which show, for purpose of illustrations only, the preferred embodiment(s) in accordance with the present invention.

DETAILED DESCRIPTION OF THE PREFERRED EMBODIMENTS

Figure 1:
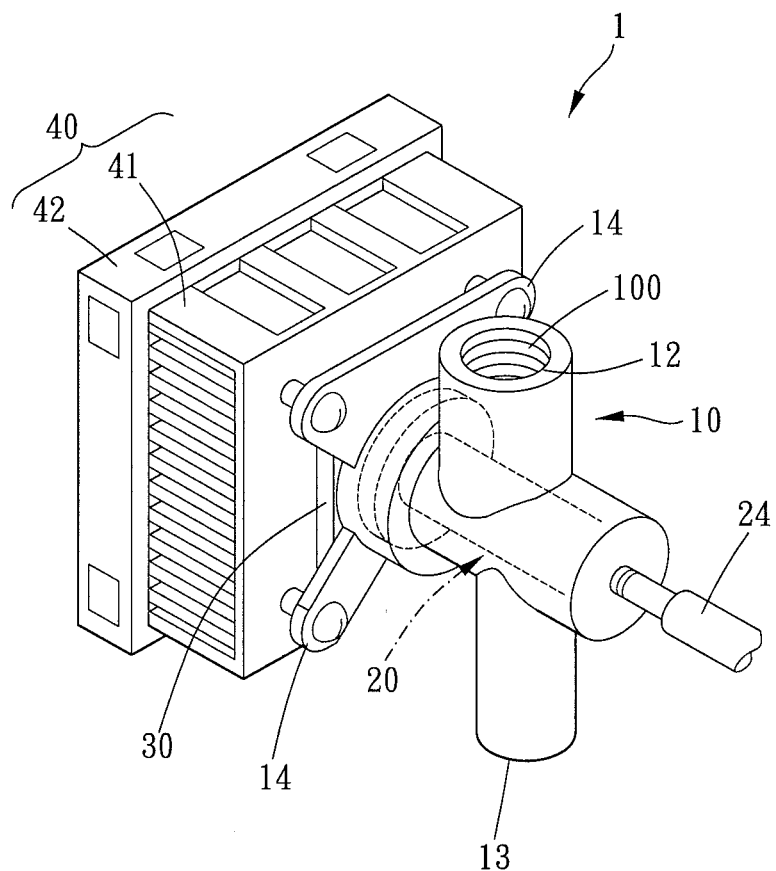
FIG. 1 is a drawing of a first preferred embodiment of the present invention.
Figure 2:
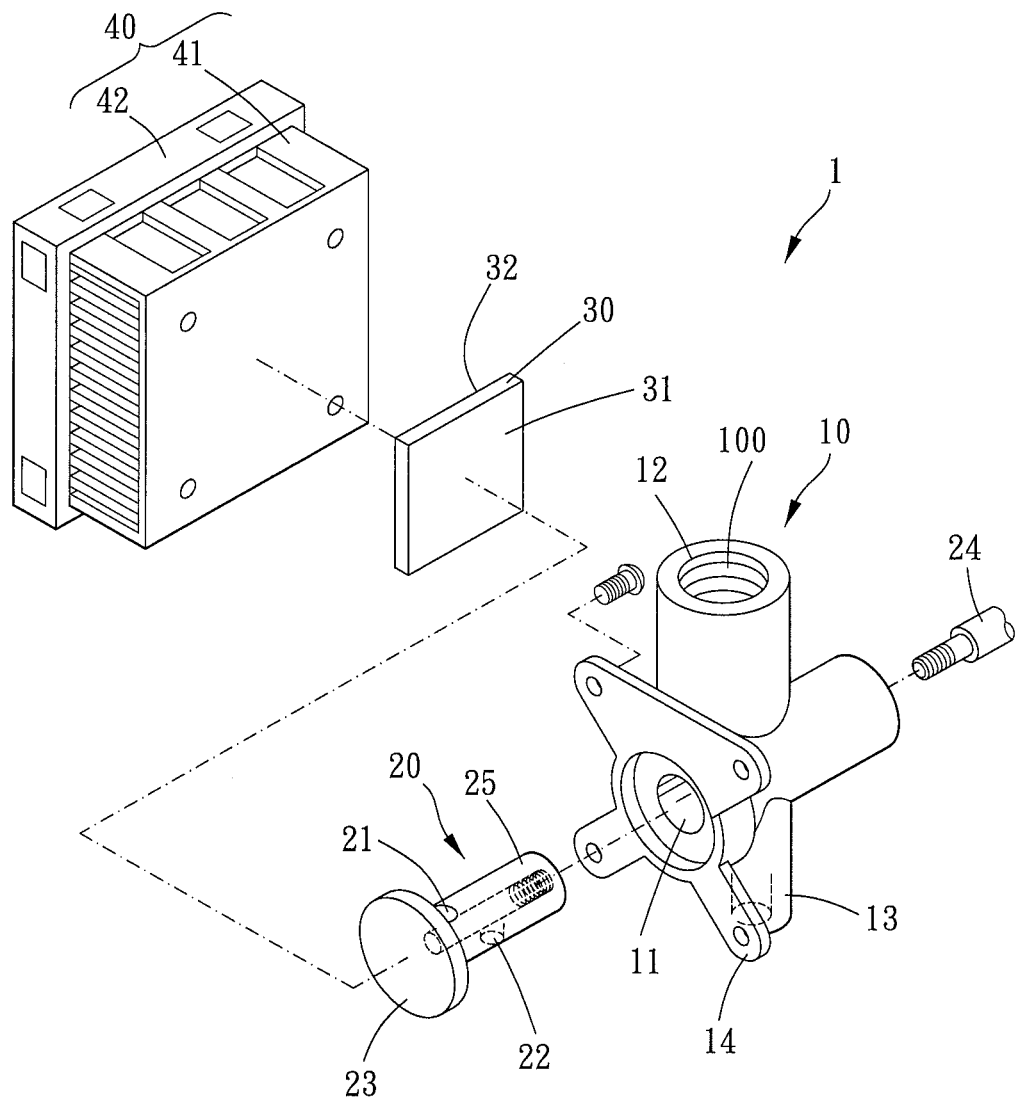
FIG. 2 is a breakdown view of the first preferred embodiment of the present invention.
Figure 3:
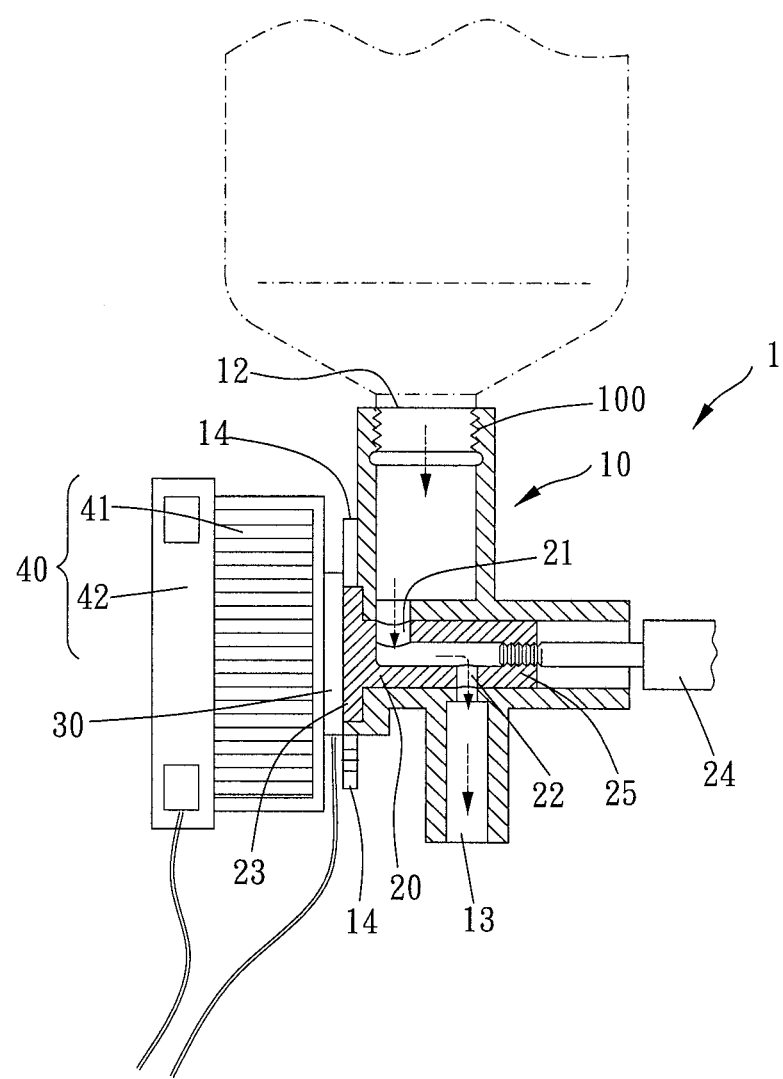
FIGS. 3 to 4 are cross-sectional views of the first preferred embodiment of the present invention.
Figure 4:
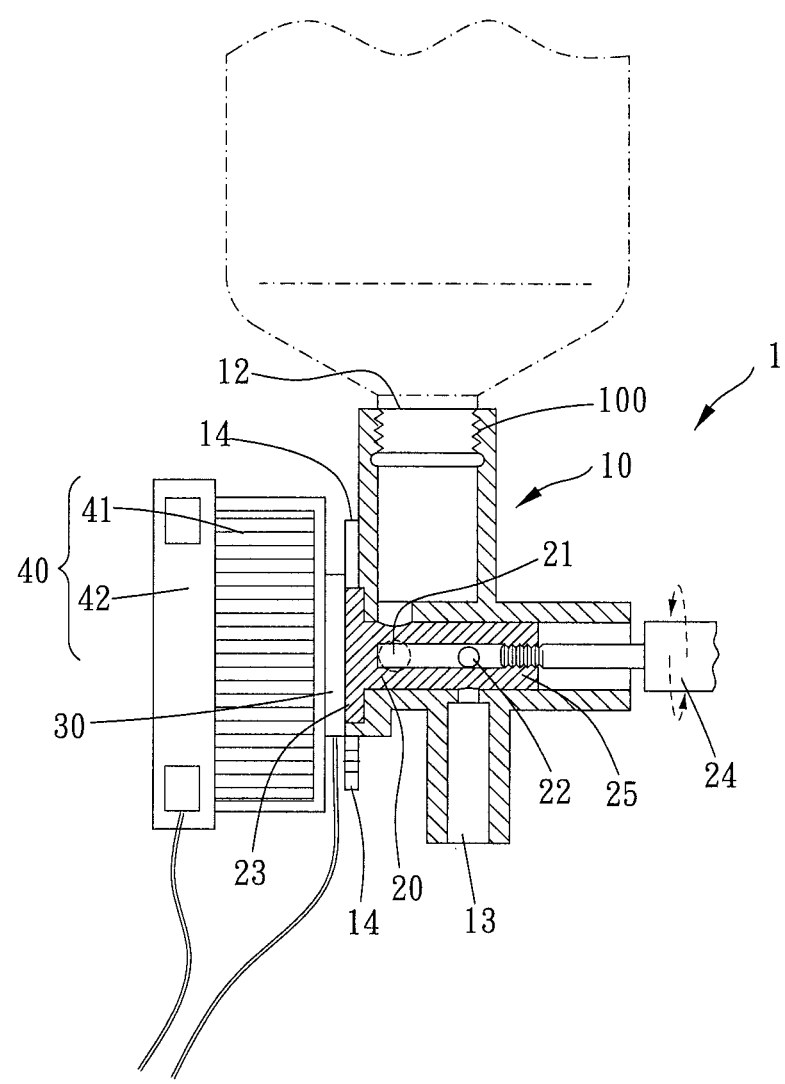

The present invention will be clearer from the following description when viewed together with the accompanying drawings, which show, for purpose of illustrations only, the preferred embodiment in accordance with the present invention.

Please refer to FIGS. 1 to 4 for a first preferred embodiment of the present invention. A temperature control valve 1 includes a main body 10, a metal valve assembly 20 and a thermoelectric chip unit 30.

The main body 10 has an interior space 11, a first inlet 12 and a first outlet 13 which communicate with the interior space 11. In this embodiment, at least one of the first inlet 12 and the first outlet 13 of the main body 10 has a threaded portion 100 to be stably assembled to a tube having different characteristics. It is understandable that the first inlet 12 and the first outlet 13 may be processed with other characteristics to be assembled to different devices.

The metal valve assembly 20 is movably disposed in the interior space 11 and includes an inlet end 21 and an outlet end 22, one of two ends of the metal valve assembly 20 on an axial direction is a closed end 23 which is engaged with and within the main body 10, the other of the two ends of the metal valve assembly 20 is an operating end 24 which is operable from outside of the main body 10 to operate the metal valve assembly 20, the operating end 24 is operated to control the first inlet 12, the first outlet 13, the inlet end 21 and the outlet end 22 to communicate or non-communicate with one another. Specifically, the closed end 23 can contact the thermoelectric chip unit 30 to exchange heat, and the closed end 23 and the thermoelectric chip unit 30 may have a heat-conducting plastic layer therebetween so as to make the heat-exchange efficiency more preferable.

In this embodiment, the metal valve assembly 20 includes a metal tube member 25, and one of the two ends of the metal tube member 25 is the closed end 23 and has a plate body so as to increase a contact area with the thermoelectric chip unit 30 to make the heat-exchange efficiency more preferable. A circumferential wall of the metal valve member 25 has the inlet end 21 and the outlet end 22, and the inlet end 21 and the outlet end 22 are on different axes so that a fluid flowing into exchanges heat with the metal tube member 25 and flows out from the outlet end 22. Specifically, the metal tube member 25 is a copper tube to conduct heat, and in other embodiments, the metal tube member 25 may be made of other materials. It is understandable that the metal tube member 25 and an interior tube may be in other shapes to increase the contact area with the fluid to exchange heat more thoroughly. For example, the metal tube member 25 may be slightly smaller than a metal solid body in the interior space 11 so that the fluid flowing in from the first inlet 12 can exchange heat with the metal solid body and flows out from the first outlet 13; and the interior tube of the metal tube member 25 may also be in honeycomb shape or other shapes to increase the contact area of heat exchange. More specifically, the main body 10 may be made of plastic so as to prevent the metal tube member 25 from exchanging heat with outside and wasting energy. It is understandable that the main body 10 may also be made of other materials other than metal to provide a preferable heat-isolation effect.

The operating end 24 is connected to the other of the two ends of the metal tube member 25. In this embodiment, the operating end 24 is a turning knob which is rotatable relative to the main body 10 and is capable of being operated and controlled to cooperate with the metal tube member 25, the turning knob comoves with the metal tube member 25, and rotation of the turning knob proceeds to control the first inlet 12 and the first outlet 13 to communicate or non-communicate with the inlet end 21 and the outlet end 22. It is understandable that a flow velocity of the fluid can be controlled through adjusting a rotation angle of the turning knob.

The thermoelectric chip unit 30 has a first end 31 and a second end 32 and is disposed on a side of the main body 10, the first end 31 of the thermoelectric chip unit 30 abuts against the closed end 23 to conduct heat, one of the first end 31 and the second end 32 is a cold end, and the other of the first end 31 and the second end 32 is a hot end. Specifically, the second end 32 of the thermoelectric chip unit 30 has a heat-dissipating module 40, the heat-dissipating module 40 has a heat-dissipating device 41 and a fan 42, and the heat-dissipating device 41 includes a plurality of heat-dissipating fins to increase a heat-dissipating rate. One of two sides of the heat-dissipating device 41 abuts against the second end 32 of the thermoelectric chip unit 30, and the fan 42 is arranged on the other of the two sides of the heat-dissipating device 41. A side of the main body 10 further extends radially to form at least one fixation ear portion 14, and the at least one fixation ear portion 14 is assembled with the heat-dissipating module 40 so that the heat-dissipating module 40 and the main body 10 are fixed by each other, and the heat-dissipating device 41, the thermoelectric chip unit 30 and the closed end 23 tightly contact one another to achieve a preferable heat-conducting effect. It is understandable that the closed end 23, the thermoelectric chip unit 30 and the heat-dissipating module 40 can exchange heat through radiation, air conduction or via other heat-conducting elements. In addition, heat exchange can be conducted via other heat-conducting elements and the thermoelectric chip unit 30 without the heat-dissipating module. When lowering a temperature, the first end 31 is the cold end, the second end 32 is the hot end, and the fan 42 is actuated to enhance the rate of dissipating the heat which is transferred from the second end 32 to the heat-dissipating device 41; and when increasing a temperature, through transferring an input current direction of the thermoelectric chip unit 30, the first end 31 is the hot end, the second end 32 is the cold end, and the fan 42 is optionally opened to prevent the heat-dissipating device 41 from vapor condensation.

Figure 5:
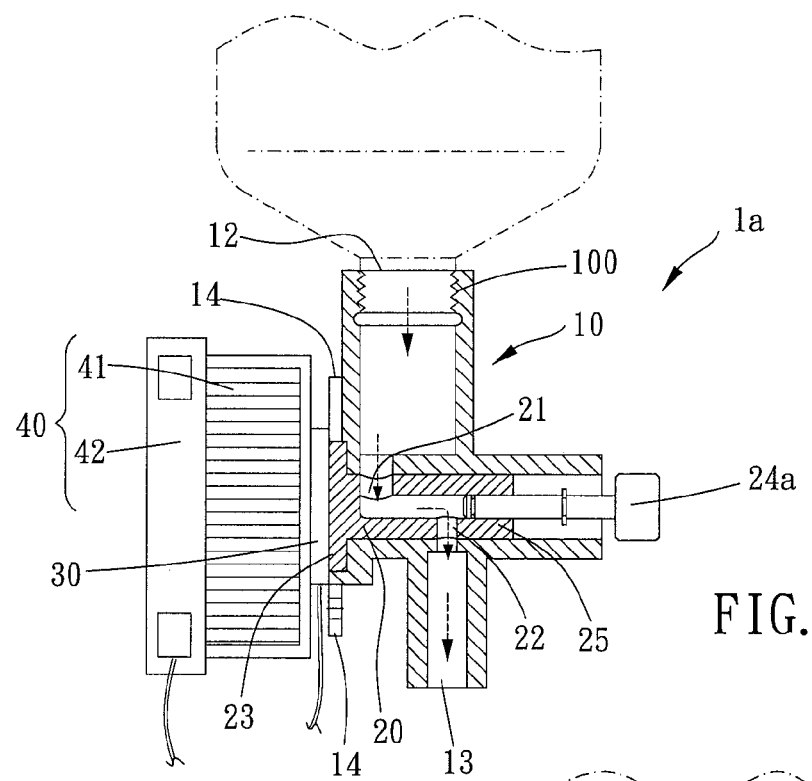
FIGS. 5 to 6 are cross-sectional views of a second preferred embodiment of the present invention.
Figure 6:
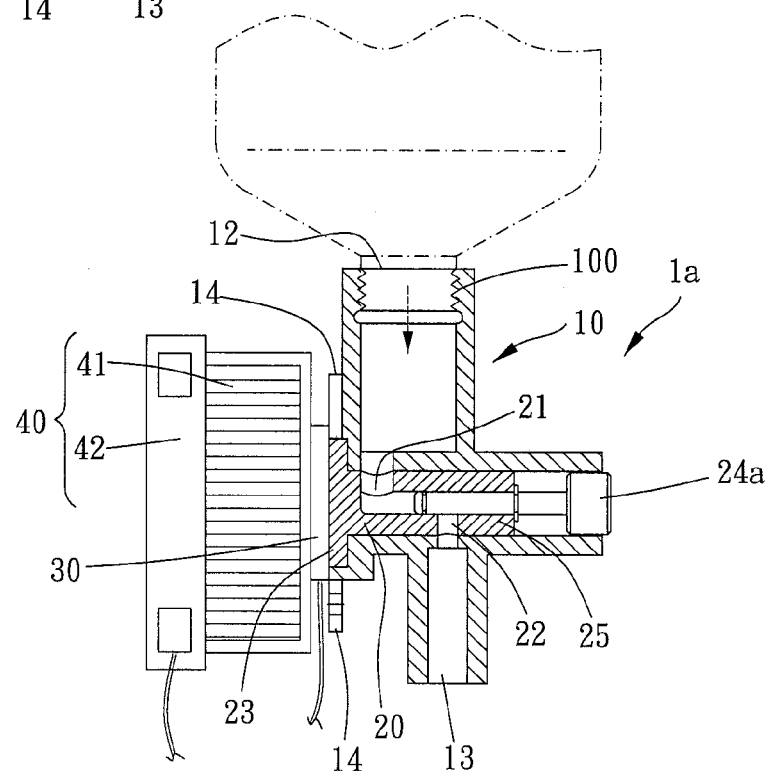

Please refer to FIGS. 5 to 6 for a temperature control valve 1a of a second embodiment. The temperature control valve 1a has an operating end 24a, the operating end 24a is an operating knob which is axially movable relative to the metal tube member 25, and the operating knob is operated to optionally cover or non-cover one of the first inlet 12, the first outlet 13, the inlet end 21 and the outlet end 22 so as to control the first inlet 12 to communicate or non-communicate with the first outlet 13. In this embodiment, the operating end 24a optionally covers the outlet end 22 so as to make the inlet end 21 communicate or non-communicate with the outlet end 22 and further to make the first inlet 12 communicate or non-communicate with the first outlet 13 to control a flow. It is understandable that the operating end 24a may also be arranged on other portions to control the flow discharge.

Figure 7:
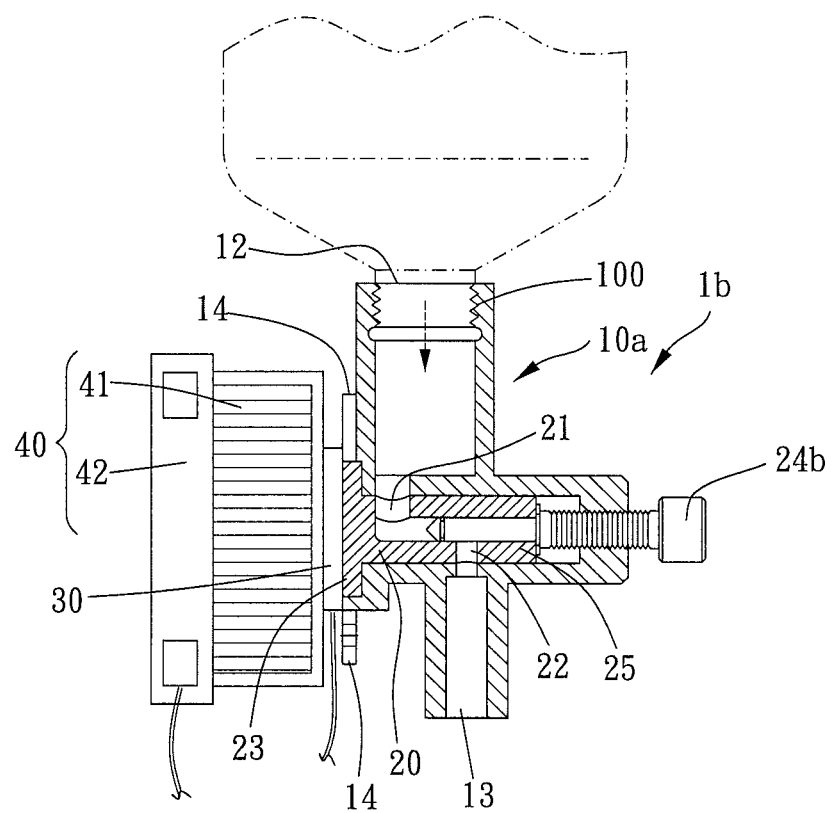
FIG. 7 is a cross-sectional view of a third preferred embodiment of the present invention.

Please refer to FIG. 7 for a temperature control valve 1b of a third embodiment. Compared with the second embodiment in FIGS. 5 to 6, the temperature control valve 1b has an operating end 24b, the operating end 24b is an operating knob which is axially movable relative to the metal tube member 25, the operating knob corresponds to a main body 10a which is threaded, and the operating knob precisely covers the outlet end 22 through being screwed in or out to control the flow charge. Preferably, the main body 10a or/and the operating knob may further has/have a blocking board to prevent the operating knob from being screwed in or out overly.

Figure 8:
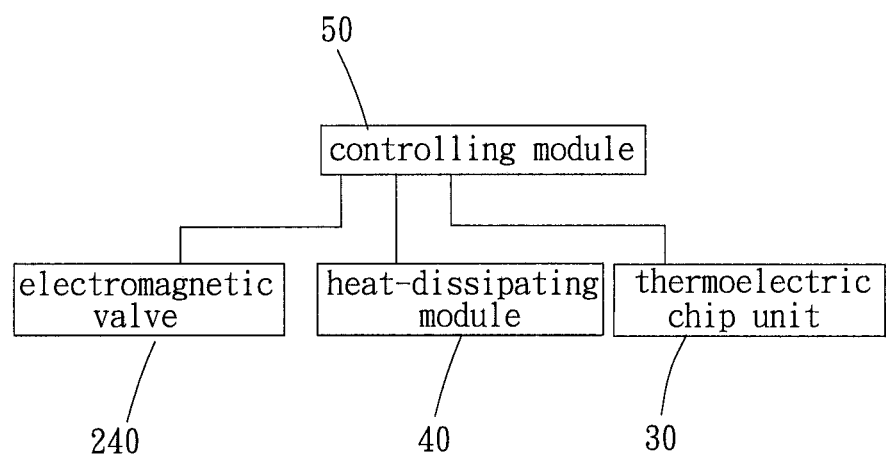
FIG. 8 is a block diagram showing a structural relationship of a fourth preferred embodiment of the present invention.

Please refer to FIG. 8 for a fourth embodiment of the present invention. The operating end includes an electromagnetic valve 240 disposed in the metal valve assembly, and at least one of the electromagnetic valve 240, the heat-dissipating module 40 and the thermoelectric chip unit 30 is electrically connected to the controlling module 50. Preferably, the controlling module 50 includes at least one temperature detector for detecting a temperature of the fluid so as to automatically control the flow charge and the temperature of the fluid of a whole device. For example, the controlling module 50 can adjust a power transmitted to the heat-dissipating module 40 and the thermoelectric chip unit 30 based on the temperature the controlling module 50 detected to make the temperature rise or fall and control the electromagnetic valve 240 to adjust the flow discharge. In this embodiment, the electromagnetic valve 240, the heat-dissipating module 40 and the thermoelectric chip unit 30 are electrically connected to the controlling module 50; and it is understandable that in other embodiments, the controlling module 50 may be only electrically connected to the heat-dissipating module 40 and the thermoelectric chip unit 30, and the operating end may be a manual valve or a mechanical valve.

Please refer to FIGS. 1 to 4, when in actual practice, the fluid flows from the first inlet 12 of the main body 10, through the outlet end 21 and into the metal tube member 25 so that the metal tube member 25 contacts the fluid to exchange heat, and the fluid with a temperature which has risen or fallen flows from the outlet end 22 and through the first outlet 13 to outside.

Given the above, the temperature control valve has the function of making the temperature rise or fall, and the temperature control valve can be used in devices like a cold drip coffee device, a drip set or a cutting fluid nozzle.

In addition, the temperature control valve has a smaller volume and is easy to be put away.

Furthermore, the main body covers the metal valve assembly to prevent the metal valve from exchanging heat with outside so as to achieve a greater transferring efficiency.

While we have shown and described various embodiments in accordance with the present invention, it should be clear to those skilled in the art that further embodiments may be made without departing from the scope of the present invention.

What is claimed is:

1. A temperature control valve, including:
a main body, having an interior space, a first inlet and a first outlet which communicate with the interior space;
a metal valve assembly, movably disposed in the interior space, including an inlet port and an outlet port, a closed end and an operating end, the closed end being engaged with and within the main body, the operating end being operable from outside of the main body to operate the metal valve assembly, the operating end being operated to control communication between the first inlet and the first outlet;
a thermoelectric chip unit, having a first end and a second end and disposed on a side of the main body, the first end of the thermoelectric chip unit abutting against the closed end, one of the first end and the second end being a cold end, the other of the first end and the second end being a hot end.

2. The temperature control valve of claim 1, wherein a heat-dissipating device abuts the second end of the thermoelectric chip unit.

3. The temperature control valve of claim 2, wherein a fan is arranged on a side of the heat-dissipating device.

4. The temperature control valve of claim 2, wherein a side of the main body further extends radially to form at least one fixation ear portion, and the at least one fixation ear portion is assembled with the heat-dissipating device.

5. The temperature control valve of claim 1, wherein the metal valve assembly includes a metal tube member, one of two ends of the metal tube member is the closed end and has a plate body, a circumferential wall of the metal tube member has the inlet port and the outlet port, the inlet port and the outlet port are on different axes, and the operating end is connected to the other of the two ends of the metal tube member.

6. The temperature control valve of claim 5, wherein the operating end is a turning knob which is rotatable relative to the main body and is capable of being operated and controlled to cooperate with the metal tube member, and rotation of the turning knob proceeds to control communication between the first inlet and the first outlet.

7. The temperature control valve of claim 5, wherein the operating end is an operating knob which is axially movable relative to the metal tube member, and the operating knob is operated to control communication between the first inlet and the first outlet.

8. The temperature control valve of claim 5, wherein the metal tube member is a copper tube.

9. The temperature control valve of claim 1, wherein the operating end includes an electromagnetic valve disposed in the metal valve assembly, and at least one of the electromagnetic valve and the thermoelectric chip unit is electrically connected to a controlling module.

10. The temperature control valve of claim 1, wherein at least one of the first inlet and the first outlet of the main body has a threaded portion.

* * * * *